United States Patent
Kawaguchi (10) Patent No.: US 8,942,774 B2
(45) Date of Patent: Jan. 27, 2015

(54) RADIO-FREQUENCY FILTER COMPRISING AN EVEN MODE RESONANCE OF A SAME PHASE INSIDE THE BANDWIDTH AND AN ODD MODE RESONANCE OF A REVERSE PHASE OUTSIDE THE BANDWIDTH

(75) Inventor: Tamio Kawaguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 13/557,583

(22) Filed: Jul. 25, 2012

(65) Prior Publication Data

US 2013/0082804 A1    Apr. 4, 2013

(30) Foreign Application Priority Data

Sep. 29, 2011 (JP) ................. 2011-213692

(51) Int. Cl.
   *H01P 1/203*   (2006.01)
   *H01B 12/02*   (2006.01)
   *H01L 39/14*   (2006.01)

(52) U.S. Cl.
   CPC ............ *H01P 1/20372* (2013.01); *H01B 12/02* (2013.01); *H01L 39/143* (2013.01)
   USPC .......................... 505/210; 333/99 S; 333/204

(58) Field of Classification Search
   CPC ............ H01P 1/20327; H01P 1/20372; H01P 1/20381; H01P 1/2039
   USPC .................. 333/99 S, 204, 219; 505/210, 704
   See application file for complete search history.

(56) References Cited

U.S. PATENT DOCUMENTS

| | | | |
|---|---|---|---|
| 5,786,303 A | 7/1998 | Mansour | |
| 6,546,266 B1 * | 4/2003 | Okazaki et al. | 505/210 |
| 6,584,332 B2 * | 6/2003 | Yoshitake et al. | 505/210 |
| 6,778,042 B2 | 8/2004 | Terashima et al. | |
| 6,903,632 B2 | 6/2005 | Hashimoto et al. | |
| 7,397,330 B2 * | 7/2008 | Kayano et al. | 333/204 |
| 2010/0141356 A1 | 6/2010 | Uhm et al. | |

FOREIGN PATENT DOCUMENTS

| | | |
|---|---|---|
| JP | 02-159102 A | 6/1990 |
| JP | 2002-141704 | 5/2002 |
| JP | 2004-349845 | 12/2004 |
| JP | 2005-269321 | 9/2005 |
| JP | 2008-42608 | 2/2008 |
| JP | 2009-55576 | 3/2009 |
| JP | 2010-141877 | 6/2010 |

* cited by examiner

*Primary Examiner* — Benny Lee
(74) *Attorney, Agent, or Firm* — Oblon, Spivak, McClelland, Maier & Neustadt, L.L.P.

(57) ABSTRACT

A resonance element according to an embodiment transmits a radio-frequency signal, and includes a first substrate, a second substrate, a first circuit element formed on the first substrate, a second circuit element formed on the second substrate, and a transmission line connecting the first circuit element and the second circuit element, and a peak of even mode resonance in which the first circuit element and the second circuit element resonate in the same phase is within a bandwidth of a transmission signal, and a peak of odd mode resonance in which the first circuit element and the second circuit element resonate in a reverse phase is outside the bandwidth.

10 Claims, 8 Drawing Sheets

RADIO-FREQUENCY FILTER COMPRISING AN EVEN MODE RESONANCE OF A SAME PHASE INSIDE THE BANDWIDTH AND AN ODD MODE RESONANCE OF A REVERSE PHASE OUTSIDE THE BANDWIDTH

CROSS-REFERENCE TO RELATED APPLICATION

This application is based upon and claims the benefit of priority from Japanese Patent Application No. 2011-213692, filed on Sep. 29, 2011, the entire contents of which are incorporated herein by reference.

FIELD

Embodiments described herein relate generally to a resonance element, a radio-frequency filter, and a wireless system.

BACKGROUND

A communication device for carrying out wireless/wired information communication is equipped with various radio-frequency components such as an amplifier, a mixer, and a filter. Among these components, a band pass filter (BPF) has a function to pass only a signal of a necessary specific frequency band (desired wave) by arranging a plurality of resonance elements.

In today's communication system, it is desired that a filter have a sharp cut-off characteristic and a low-loss characteristic in order to maximize available bandwidths in terms of efficient use of frequencies and elimination of interference. To realize these filter characteristics, it is necessary to mutually connect a plurality of resonance elements in an electromagnetic field. A circuit constant of the filter is determined based on the following parameters: 1: Resonance frequency fi of each resonance element, 2: Coupling coefficient Mij between resonators i and j, 3: External quality factor (Qe) coupling of an external circuit.

To improve steepness of a filter, it is necessary to increase the number of resonance elements, and to make the filter multi-pole; however, in general, insertion loss increases as the number of resonance elements increases, and thus, the insertion loss and the number of the resonance elements are in a trade-off relationship. Further, when there is structural restriction in configuring a multi-pole filter, there is a way to connect each resonance element by a transmission line such as a cable to make a filter multi-pole. Further, another way is to make groups configured from a plurality of resonance elements, and to connect the groups by a transmission line such as a cable to configure a filter.

However, in either case, loss of the cable or the like used for connection influences and deteriorates the filter characteristics. Especially, in a case of a superconducting filter, which has a low-loss characteristic, connection loss significantly deteriorates the filter characteristic. Therefore, a method for connecting resonance elements with low loss is desired.

Also, in wireless power transmission, which has been well-developed in recent years, power transmission is carried out by using and connecting a coil and resonance elements. However, connection amount decreases as a distance between the resonance elements increases, which lowers transfer efficiency.

DETAILED DESCRIPTION OF THE INVENTION

A resonance element of embodiments transmits a radio-frequency signal, and includes a first substrate, a second substrate, a first circuit element formed on the first substrate, a second circuit element formed on the second substrate, and a transmission line (or transmission path) connecting the first circuit element and the second circuit element, and a peak of even mode resonance in which the first circuit element and the second circuit element resonate in the same phase is within a bandwidth of a transmission signal, and a peak of odd mode resonance in which the first circuit element and the second circuit element resonate in a reverse phase is outside the bandwidth.

Hereinafter, embodiments will be described with reference to the appended drawings. Note that, in the drawings, the same or similar elements are denoted with the same reference numbers and may not be described in all drawing figures in which they appear.

[First Embodiment]

A resonance element of the present embodiment transmits a radio-frequency signal, and includes a first substrate, a second substrate, a first circuit element formed on the first substrate, a second circuit element formed on the second substrate, and a transmission line (or transmission path) connecting the first circuit element and the second circuit element, and a peak of even mode resonance in which the first circuit element and the second circuit element resonate in the same phase is within a bandwidth of a transmission signal, and a peak of odd mode resonance in which the first circuit element and the second circuit element resonate in a reverse phase is outside the bandwidth.

Further, a radio-frequency filter of the present embodiment includes: a first substrate; a second substrate; a first resonance element including a first circuit element formed on the first substrate, a second circuit element formed on the second substrate, and a transmission line connecting the first circuit element and the second circuit element, a peak of even mode resonance in which the first circuit element and the second circuit element resonate in the same phase being within a bandwidth of a filter circuit, a peak of odd mode resonance in which the first circuit element and the second circuit element resonate in a reverse phase falling outside the bandwidth; a second resonance element formed on the first substrate and connected to the first resonance element; and a third resonance element formed on the second substrate and connected to the first resonance element.

In the present embodiment, circuit elements which are arranged on two different substrates, and resonate at almost the same frequency are connected by a transmission line. Then, an electrical length of the transmission line is set within a predetermined range, and an even mode resonating part of a connected frequency characteristic is selectively used. In this way, the above configuration as a whole is deemed and used as one resonance element. Accordingly, current flowing though the transmission line can be reduced, whereby loss in the resonance element can be reduced.

Figure 1A:
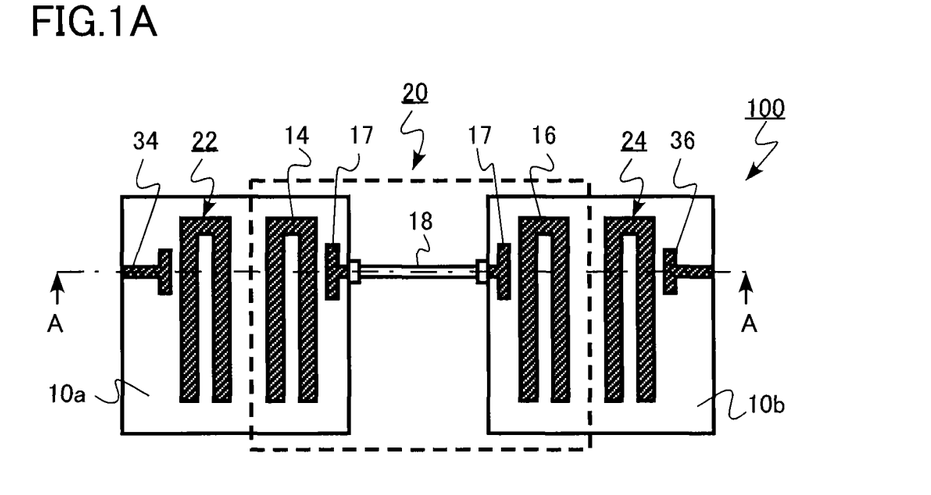
FIGS. 1A and 1B are schematic diagrams of a resonance element and a radio-frequency filter according to a first embodiment.
Figures 1B, 2:
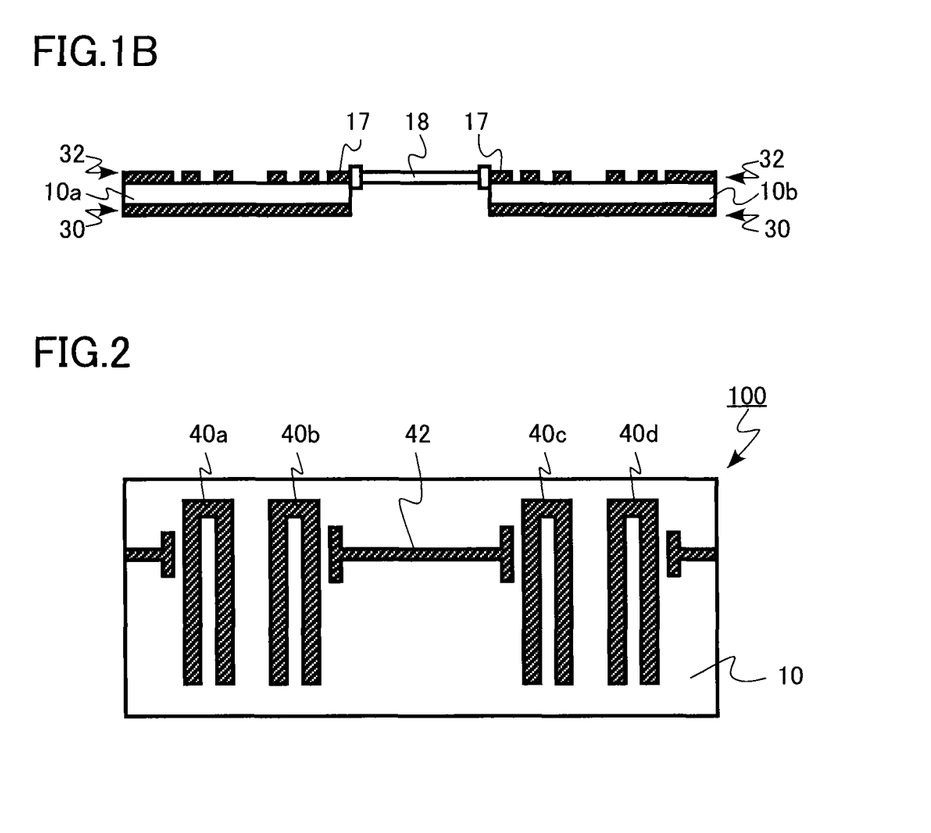
FIG. 2 is a schematic top view showing an example of a four-pole band pass filter by means of line connection.

FIGS. 1A and 1B are schematic diagrams of the resonance element and the radio-frequency filter according to the present embodiment. FIG. 1A is a top view, and FIG. 1B is an A-A sectional view of FIG. 1A.

A radio-frequency filter 100 (FIG. 1A) of the present embodiment is a three poles band pass filter. The radio-frequency filter 100 includes a first dielectric substrate 10a and a second dielectric substrate 10b. Further, the radio-frequency filter 100 includes a first resonance element 20 (FIG. 1A) that is configured from a first circuit element 14 (FIG. 1A) formed on the first dielectric substrate 10a, a second circuit element 16 (FIG. 1A) formed on the second dielectric substrate 10b, and a transmission line 18 that connects the first circuit element 14 and the second circuit element 16. Further, the radio-frequency filter 100 is configured such that a peak of even mode resonance in which the first circuit element 14 and the second circuit element 16 resonate in the same phase is within a bandwidth of the first frequency filter 100, and a peak of odd mode resonance in which the first circuit element 14 and the second circuit element 16 resonate in a reverse phase is outside the bandwidth.

Further, as shown in FIG. 1A, the radio-frequency filter 100 includes a second resonance element 22 formed on the first dielectric substrate 10a and connected to the first resonance element 20, and a third resonance element 24 formed on the second dielectric substrate 10b and connected to the first resonance element 20.

In the present embodiment, as shown in FIG. 1B, a microstrip line structure is used as a circuit structure for each resonance element. The structure includes a ground conductor 30 at one side of the dielectric substrate, and a line conductor 32 at the other side of the dielectric substrate.

The radio-frequency filter 100 includes an input line 34 and an output line 36 as shown in FIG. 1A. The input line 34 is connected to the second resonance element 22 which is to act as a first resonance element. The second resonance element 22 is connected to the first resonance element 20 which is to act as a second resonance element. The first resonance element 20 is connected to the third resonance element 24 which is to act as a third resonance element. Finally, the third resonance element 24 is connected to the output line 36.

Single half wavelength hairpin resonance elements are used for the second resonance element 22 and the third resonance element 24. In the first resonance element 20, the two half wavelength hairpin resonance elements, that is, the first circuit element 14 and the second circuit element 16 are connected each other by a connection line 17 and the transmission line 18 which is a coaxial cable. In this way, the above configuration as a whole is used as a single resonance element.

The first resonance element 20 is configured such that a peak of even mode resonance in which the first circuit element 14 and the second circuit element 16 resonate in the same phase is within the bandwidth of the first frequency filter 100, and a peak of odd mode resonance in which the first circuit element 14 and the second circuit element 16 resonate in a reverse phase is outside the bandwidth.

In a case of a radio-frequency filter, when a central frequency of the radio-frequency filter 100 is represented as $f_0$ and the bandwidth is represented as BW, the above condition can be satisfied when an electrical length $\phi$ of the transmission line 18 satisfies the following formula (Formula 1).

$$0 < \phi < 90 - \frac{BW}{f_0} \cdot 180,$$

$$90 \cdot n + \frac{BW}{f_0} \cdot 180 < \phi < 90 \cdot (n+1) - \frac{BW}{f_0} \cdot 180$$

formula 1

(n is a positive integer)

Examples of conductive material of the ground conductor 30 and the line conductor 32 include metal such as copper or gold, a superconductor such as niobium or niobium-tin, and a Y-based copper oxide high-temperature superconductor. Especially, the present embodiment uses a low-loss conductor like a superconductor as the conductive material, which produces a profound effect when there is large difference of loss with the transmission line.

The dielectric substrates 10a and 10b are, for example, magnesium oxide, sapphire, or lanthanum aluminate. For example, a superconducting microstrip line is formed on a magnesium oxide substrate having thickness of about 0.43 mm, and a dielectric constant of about 10. Here, a Y-based copper oxide high-temperature superconducting thin film having thickness of about 500 nm is used for a superconductor of the microstrip line, and a line width of the strip line conductor is about 0.4 mm. On the back side of the magnesium oxide substrate, a ground conductor of the Y-based copper oxide high-temperature superconducting thin film having thickness of about 500 nm is formed, for example.

Further, to obtain a high-quality Y-based copper oxide high-temperature superconducting film, a buffer layer can be provided between the dielectric substrate and the superconducting film. Examples of the buffer layer include $CeO_2$, YSZ, and the like. The superconducting thin film can be formed by a laser deposition method, a sputtering method, a co-deposition method, or a MOD (Metal Organic Deposition) method.

Also, as the filter structure, various structures other than the microstrip line can be adopted such as a strip line, a coplanar line, a waveguide, or a coaxial line. Further, the shape of the resonance element is not limited to hairpin, and various resonance structures can be adopted. Furthermore, not only the above examples but also various resonance elements such as a dielectric resonance element or a cavity resonance element can be used.

Next, an operation/effect of the resonance element and the radio-frequency filter of the present embodiment will be described.

In general, as a way of connecting resonance elements which configure a band pass filter, gap connection for connecting the resonance elements via a space, and line connection for connecting the resonance elements via a connection line can be considered.

Figure 3:
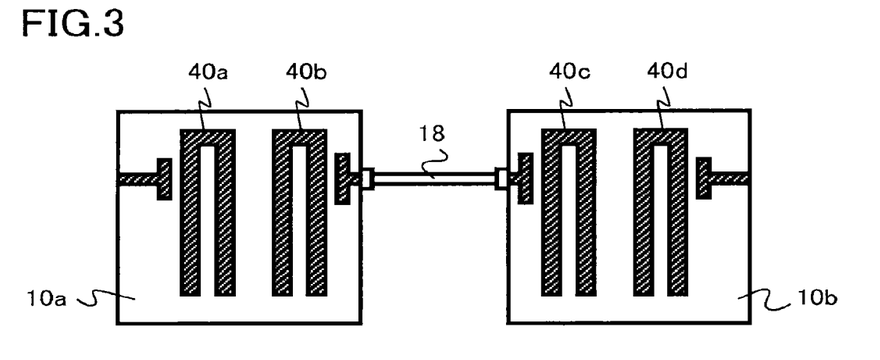
FIG. 3 is a schematic top view showing an example of a four-pole band pass filter by means of line connection.

FIGS. 2 and 3 are schematic top views respectively showing examples of four-pole band pass filters by means of line connection. As the resonance element, half wavelength hairpin resonance elements 40a to 40d are used. Here, FIG. 2 is an example in which a transmission line 42 is patterned on one dielectric substrate 10. That is, this is a case where a transmission line is a low-loss transmission line.

Also, FIG. 3 is an example in which the dielectric substrates 10a and 10b configured from two hairpin resonance elements patterned on separate dielectric substrates are connected by the coaxial cable 18 by means of line connection. That is, this is a case where the transmission line is a high-loss transmission line.

In the case of FIG. 2, it is necessary that four resonance elements be accommodated in a dielectric substrate to be used. On the other hand, in the case of FIG. 3, resonance elements are separately arranged to two dielectric substrates respectively, whereby there is an advantage of reducing the size of the substrate to half. However, in the case of FIG. 3, the loss of the coaxial cable 18 used for connecting the dielectric substrates may become a problem.

Figure 4:
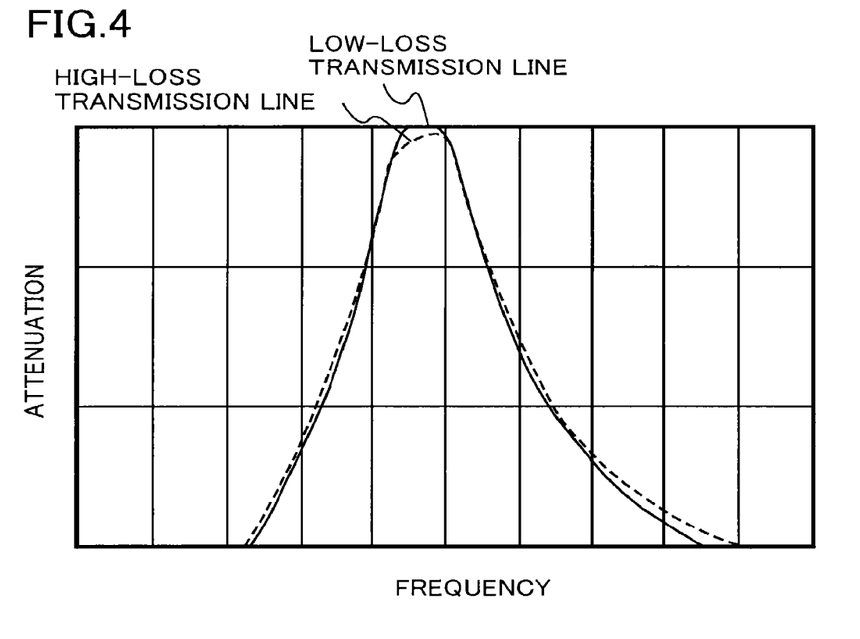
FIG. 4 is a diagram showing calculation results of frequency characteristics of the four-pole filters of FIGS. 2 and 3.

FIG. 4 is a diagram showing calculation results of frequency characteristics of the four-pole filters of FIGS. 2 and 3. The horizontal axis corresponds to signal frequency, and the vertical axis corresponds to signal attenuation. In the case of the low-loss transmission line of FIG. 2, calculation is carried out without considering loss. Meanwhile, in the case of the high-loss transmission line of FIG. 3, calculation is carried out without considering loss of the conductor pattern, but with the loss of the coaxial cable being considered.

As a result of the calculation, it can be seen that an ideal filter characteristic with low insertion loss has been acquired for the characteristic of FIG. 2, whereas the characteristic of FIG. 3 has high insertion loss due to influence of the coaxial cable loss.

Figure 5:
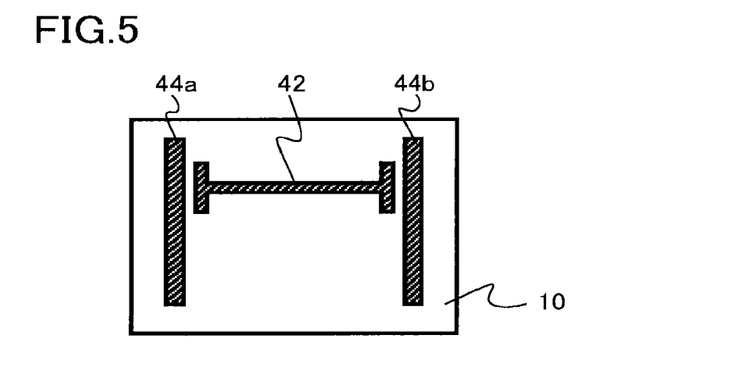
FIG. 5 is a schematic top view showing a pattern for which the frequency characteristic has been calculated.
Figure 6:
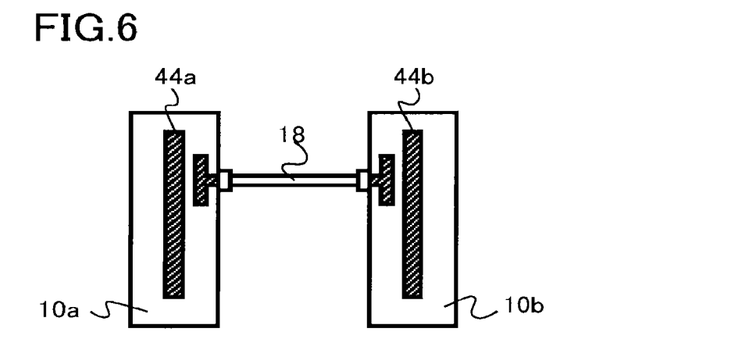
FIG. 6 is a schematic top view showing a pattern for which the frequency characteristic has been calculated.

Therefore, to find out the cause of the characteristic deterioration, calculation is carried out for another pattern. FIGS. 5 and 6 are schematic top views showing another two patterns for which calculation of frequency characteristics is carried out. The pattern of FIG. 5 is an example in which half wavelength linear resonance elements 44a and 44b are connected by means of line connection by the transmission line 42 having no loss, which is arranged on the same dielectric substrate 10. That is, this is a case where the transmission line is a low-loss transmission line. Here, connection with an outside circuit is by means of gap connection.

On the other hand, the pattern of FIG. 6 is an example in which the linear resonance elements 44a and 44b are respectively arranged on the two separate dielectric substrates 10a and 10b, and are connected by the coaxial cable 18 having loss. That is, this is a case where the transmission line is a high-loss transmission line.

Figure 7:
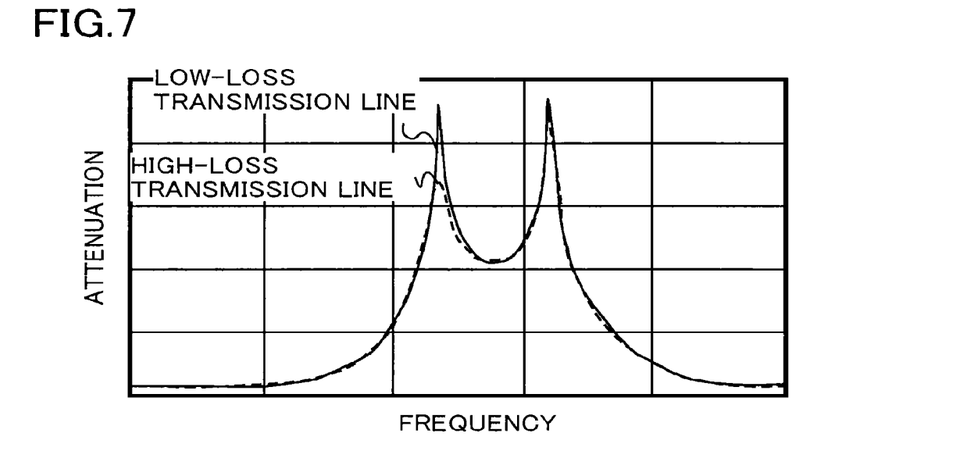
FIG. 7 is a diagram showing calculation results of the frequency characteristics of the respective patterns of FIGS. 5 and 6.

FIG. 7 is a diagram showing calculation results of the frequency characteristics of the respective patterns of FIGS. 5 and 6. The horizontal axis corresponds to signal frequency, and the vertical axis corresponds to signal attenuation.

As a result of the calculation, a result has been acquired in which a peak at a low frequency side is largely decreased when the coaxial cable having loss is used. On the other hand, it can be seen that a peak at radio-frequency side seems mostly unchanged.

According to the diagram, it has turned out that the transmission line having loss significantly influences the resonance peak at the low frequency side, and has little impact on the peak at the radio-frequency side.

Figure 8A:
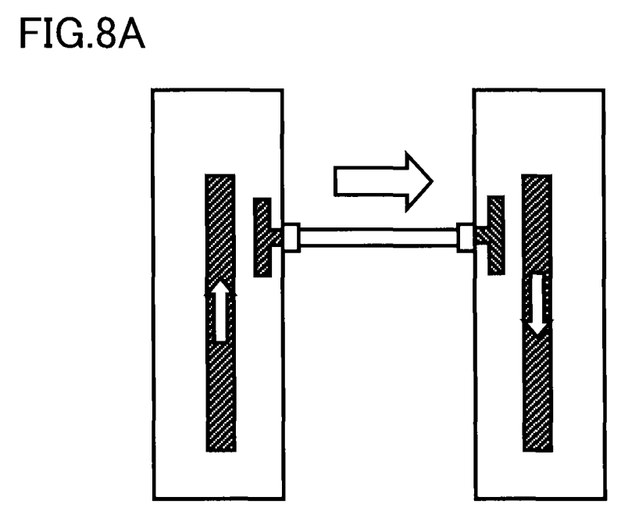
FIGS. 8A and 8B are schematic diagrams showing current distribution of resonant peaks of FIG. 7.
Figure 8B:
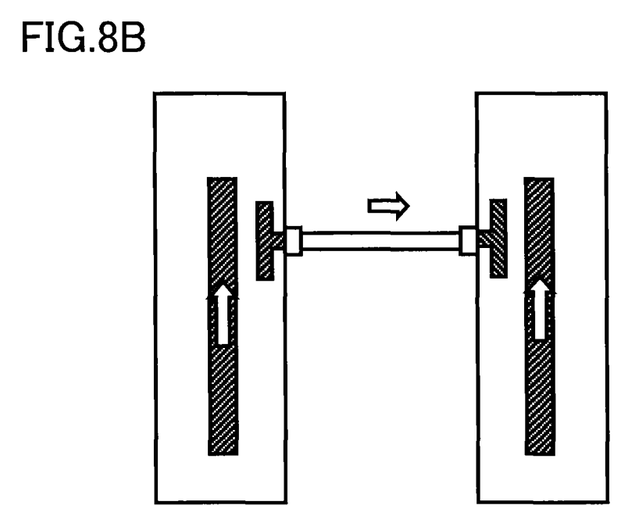

FIGS. 8A and 8B are schematic diagrams showing current distribution of the resonant peaks of FIG. 7. FIG. 8A shows a case of the peak at the low frequency side, and FIG. 8B shows a case of the peak at the radio-frequency side. The directions of the arrows schematically represent directions of current flow, and the sizes of the arrows schematically represent magnitudes of the current.

According to the diagrams, it can be seen that, in FIG. 8A where the resonance peak is significantly influenced by the loss of the transmission line, the two resonance elements resonate in a reverse phase in odd mode resonance. Accordingly, the current flowing through the transmission line increases, whereby the resonance peak is significantly influenced by the loss of the transmission line.

On the other hand, in FIG. 8B, the two resonance elements resonate in the same phase in even mode resonance. Accordingly, the current flowing through the transmission line is reduced, whereby influence of the loss is small.

According to the above result, even in a case where there is the loss of the transmission line, it is possible to reduce the influence of the loss as long as the even mode resonance can be selectively used. That is, as shown in the embodiment of FIG. 1, by using the two resonance elements and the transmission line which connects therebetween by means of even mode connection as one resonance element, the influence of the loss of the transmission line can be reduced.

Figure 9:
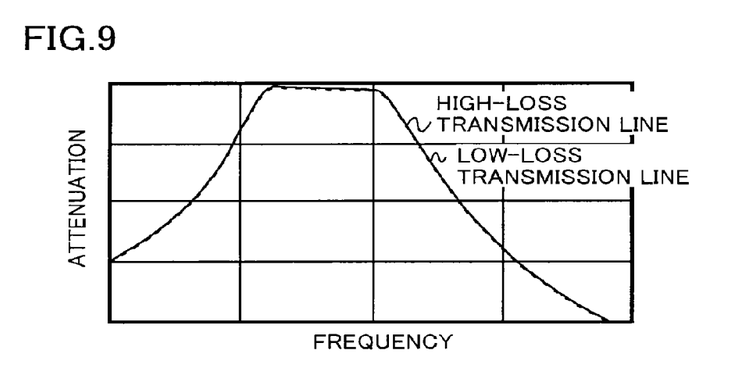
FIG. 9 is a diagram showing a calculation result of a frequency characteristic of the radio-frequency filter of FIG. 1.

FIG. 9 is a diagram showing calculation results of frequency characteristics of the radio-frequency filter of FIG. 1. The calculation results respectively show the frequency characteristics of the three-pole filter shown in FIG. 1 in cases of the transmission line having loss and of the transmission line having no loss, that is, in cases of a low-loss transmission line and of a high-loss transmission line. As a result of the calculation, almost the same characteristics have been obtained in the cases of having loss and having no loss, whereby the characteristics are not significantly deteriorated unlike in the case of FIG. 4.

As described above, it is possible to reduce the influence of the loss of the transmission line by causing the peak of the even mode resonance in which the first circuit element and the second circuit element resonate in the same phase to fall within the bandwidth of the radio-frequency filter, and the peak of the odd mode resonance in the reverse phase to fall outside the bandwidth, and by selectively using only the even mode resonance.

Therefore, for example, even in a case where a multi-pole filter is formed by different substrates because a large substrate is in short supply or a large substrate cannot be used due to structural restriction, influence to the filter characteristic due to the loss of the transmission line can be reduced.

Therefore, according to the present embodiment, a resonance element and a radio-frequency filter using the same can be realized, which are capable of reducing loss which occurs when a plurality of resonance elements is connected by a transmission line, and of realizing a low-loss filter.

Note that, in the present embodiment, the example has been described in which the configuration of the first resonance element 20 of FIG. 1 is used as the resonance element of the radio-frequency filter; however, the configuration of the resonance element can be used as a single resonator. In this case, it is configured such that a peak of even mode resonance in which the first circuit element 14 and the second circuit element 16 resonate in the same phase is within a bandwidth of a transmission signal, and a peak of odd mode resonance in which the first circuit element 14 and the second circuit element 16 resonate in a reverse phase is outside the bandwidth.

Further, in a case where the resonance element is used as the single resonator, when a central frequency of the transmission signal is represented as $f_0$ and the bandwidth thereof is represented as BW, the above condition can be satisfied when an electrical length φ of the transmission line 18 satisfies the following formula (Formula 1).

$$0 < \phi < 90 - \frac{BW}{f_0} \cdot 180,$$

$$90 \cdot n + \frac{BW}{f_0} \cdot 180 < \phi < 90 \cdot (n+1) - \frac{BW}{f_0} \cdot 180$$

formula 1

(n is a positive integer)

According to the embodiment, a low-loss resonator can be realized.

[Second Embodiment]

A radio-frequency filter according to the present embodiment is similar to that of the first embodiment except that the radio-frequency filter of the first embodiment is made multi-pole, that is, except for the number of the resonance elements. Therefore, contents which overlap with the first embodiment are omitted.

Figure 10:
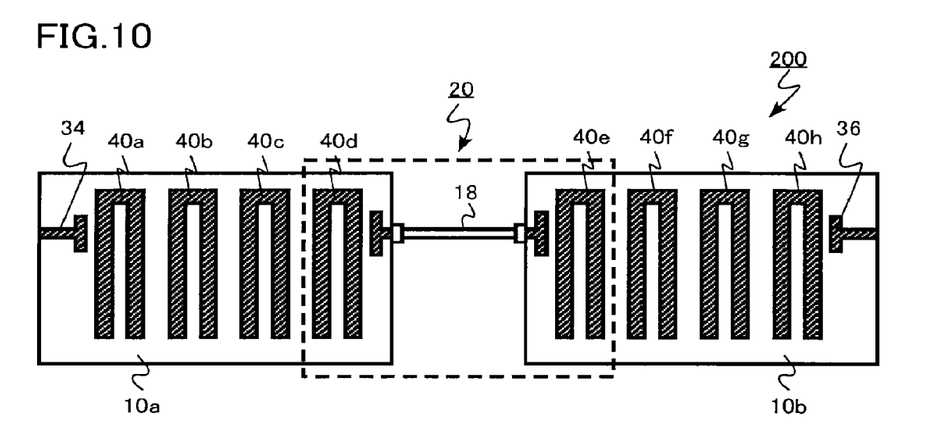
FIG. 10 is a schematic top view of a radio-frequency filter according to a second embodiment.

FIG. 10 is a schematic top view of a radio-frequency filter of the present embodiment. In a radio-frequency filter 200, four resonance elements are arranged on each of two separate dielectric substrates 10a and 10b. That is, hairpin resonance elements 40a, 40b, 40c and 40d are arranged on the dielectric substrate 10a, and hairpin resonance elements 40e, 40f, 40g and 40h are arranged on the dielectric substrate 10b. Further, the hairpin resonance element 40d and the hairpin resonance element 40e are connected by a transmission line of a coaxial cable 18.

To reduce influence of loss of the coaxial cable 18, the hairpin resonance element (a first circuit element) 40d and the hairpin resonance element (a second circuit element) 40e connected by the coaxial cable 18. The two resonators and coupling line operate as even and odd mode resonance. The even mode is used and the two resonators and coupling line operate as one resonance element (a first resonance element) 20 which is connected by means of even mode connection. Therefore, the radio-frequency filter of the present embodiment is a seven-pole band pass filter.

According to the present embodiment, a radio-frequency filter can be realized, which has a sharp cut-off characteristic compared to the first embodiment, by causing a resonance element to be multi-pole.

Figure 11:
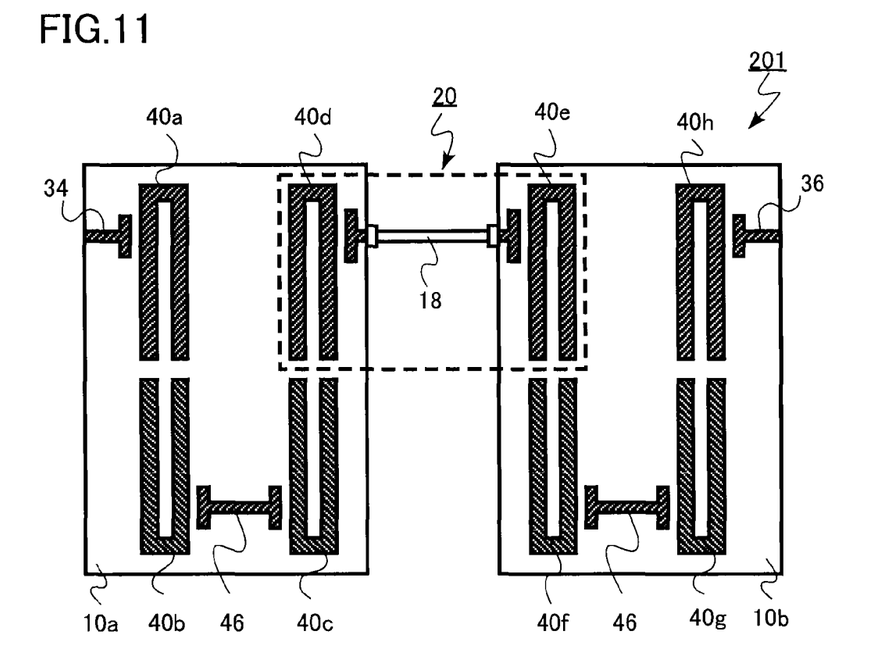
FIG. 11 is a schematic top view of a radio-frequency filter according to a modification of the second embodiment.

FIG. 11 is a schematic top view of a radio-frequency filter according to a modification of the present embodiment. A radio-frequency filter 201 differs from the radio-frequency filter 200 in arrangement of the hairpin resonance elements 40a to 40h, and in connection method thereof.

In the radio-frequency filter 201, there are low-loss connection lines 46 between the hairpin resonance elements 40b and 40c, and between the hairpin resonance elements 40f and 40g. However, to realize a multi-pole filter in a case where a size of the substrate is restricted, it is necessary that parts of the resonance elements patterned on the plurality of substrates be connected with a line having loss like a coaxial cable 18, as shown in the present modification.

According to the present embodiment, a radio-frequency filter can be realized, which has a high Q value and a sharp cut-off characteristic compared to the first embodiment, by causing a resonance element to be multi-pole.

[Third Embodiment]

A resonance element and a radio-frequency filter according to the present embodiment are similar to those of the first embodiment except that a third substrate is further provided, the transmission line is formed on the third substrate, and the first circuit element and the transmission line, and the second circuit element and the transmission line are connected with a spacing. Therefore, contents which overlap with the first embodiment are omitted.

Figure 12:
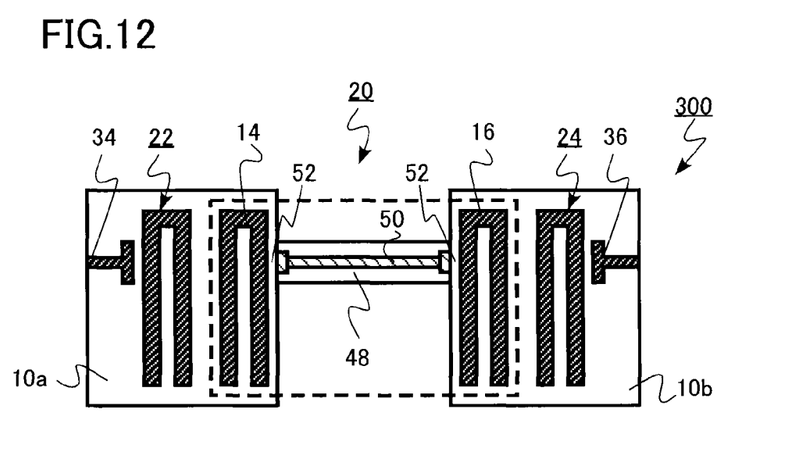
FIG. 12 is a schematic top view of a radio-frequency filter according to a third embodiment.

FIG. 12 is a schematic top view of a radio-frequency filter according to the present embodiment.

A radio-frequency filter 300 of the present embodiment is a three poles band pass filter. The radio-frequency filter 300 includes a first dielectric substrate 10a and a second dielectric substrate 10b. Also, the radio-frequency filter 300 includes a first circuit element 14 formed on the first dielectric substrate 10a and a second circuit element 16 formed on the second dielectric substrate 10b.

Further, the first circuit element 14 and the second circuit element 16 are connected by a line 50 which is patterned on a microstrip line substrate (a third substrate) 48. That is, in the present embodiment, a transmission line is a line patterned on the microstrip line substrate.

Further, the first circuit element 14 and the line 50, and the second circuit element 16 and the line 50 are connected with a spacing 52. That is, necessary connection is realized by means of gap connection.

Furthermore, it is configured such that a peak of even mode resonance in which the first circuit element 14 and the second circuit element 16 resonate in the same phase is within a bandwidth of the radio-frequency filter 300, and a peak of odd mode resonance in which the first circuit element 14 and the second circuit element 16 resonate in a reverse phase is outside the bandwidth.

According to the present embodiment, a low-loss radio-frequency filter can be realized like the first embodiment.

Figure 13A:
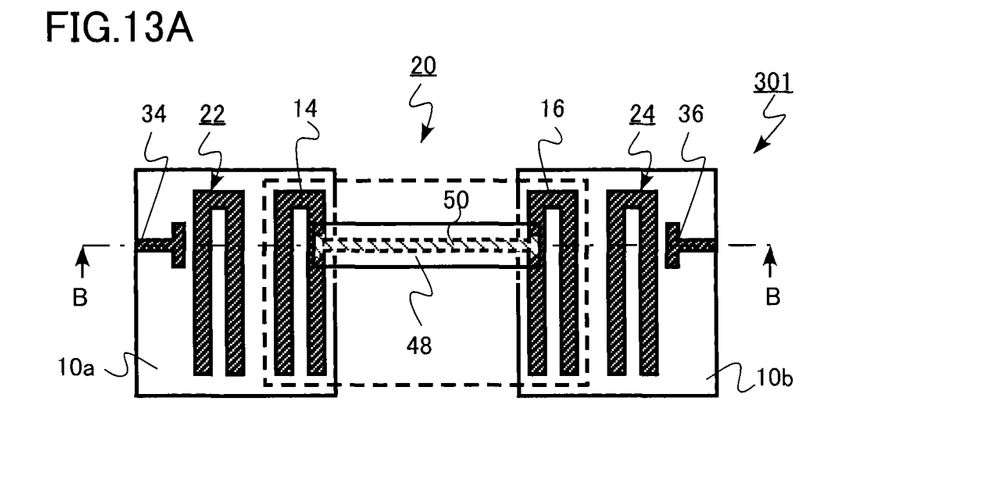
FIGS. 13A and 13B are schematic top views of a radio-frequency filter according to a modification of the third embodiment.
Figure 13B:
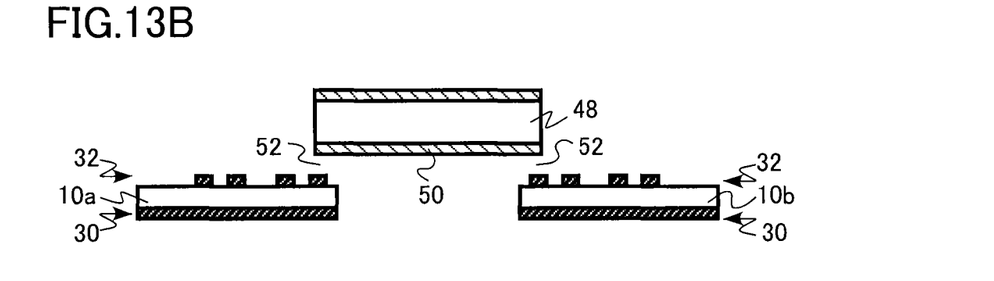

FIGS. 13A and 13B are schematic diagrams of a radio-frequency filter of a modification according to the present embodiment. FIG. 13A is a top view, and FIG. 13B is a B-B sectional view of FIG. 13A. In a radio-frequency filter 301 (FIG. 13A), the microstrip line substrate 48 is arranged such that the line 50 formed on the substrate faces a line conductor 32 (FIG. 13B) of the first circuit element 14 and the second circuit element 16 with a spacing (gap) 52 (FIG. 13B). In this way, necessary connection can be realized by means of gap connection between the first circuit element 14 and the second circuit element 16, and the line 50 as shown in FIG. 13A.

According to the present embodiment, a low-loss radio-frequency filter can be realized like the first embodiment. Also, the degree of connection can be easily adjusted by changing the distance between the first circuit element 14 and the second circuit element 16, and the line 50.

[Fourth Embodiment]

A resonance element and a radio-frequency filter according to the present embodiment are similar to those of the first embodiment except that a part of the transmission line that connects the first circuit element and the second circuit element is a waveguide. Therefore, contents which overlap with the first embodiment are omitted.

Figure 14:
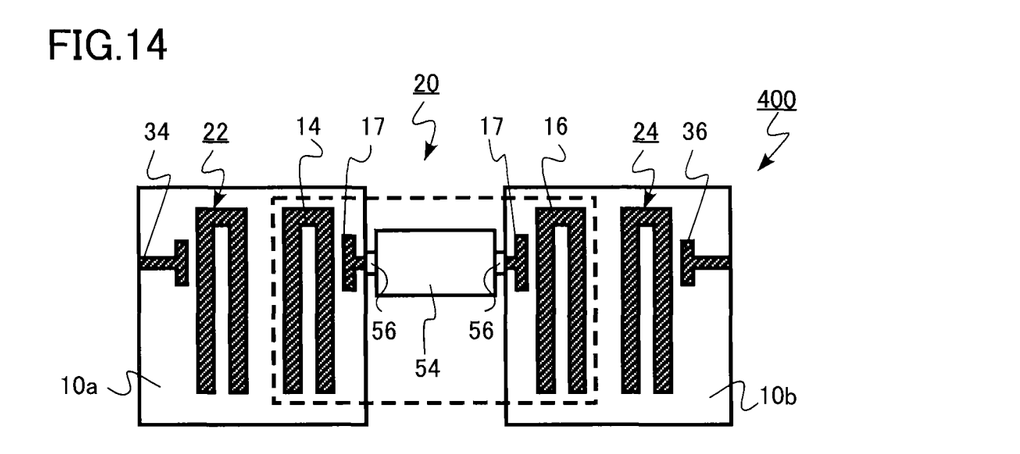
FIG. 14 is a schematic top view of a radio-frequency filter according to a fourth embodiment.

FIG. 14 is a schematic top view of a radio-frequency filter according to the present embodiment.

A radio-frequency filter 400 of the present embodiment is a three poles band pass filter. The radio-frequency filter 400 includes a first dielectric substrate 10a and a second dielectric substrate 10b. Further, the radio-frequency filter 400 includes a first circuit element 14 formed on the first dielectric substrate 10a and a second circuit element 16 formed on the second dielectric substrate 10b.

Further, the first circuit element 14 and the second circuit element 16 are mutually connected by a waveguide 54 and connectors 56 which connect the first dielectric substrate 10a, the second dielectric substrate 10b, and the waveguide 54. That is, in the present embodiment, a part of the transmission line is the waveguide 54.

According to the present embodiment, a low-loss radio-frequency filter can be realized like the first embodiment. Also, by using the waveguide as the transmission line, lower-loss connection than the first embodiment which uses the coaxial cable can be realized.

[Fifth Embodiment]

A wireless system according to the present embodiment is a wireless system which includes any of the radio-frequency filters of the first to fourth embodiments. Therefore, contents which overlap with the first to fourth embodiments are omitted.

Figure 15:
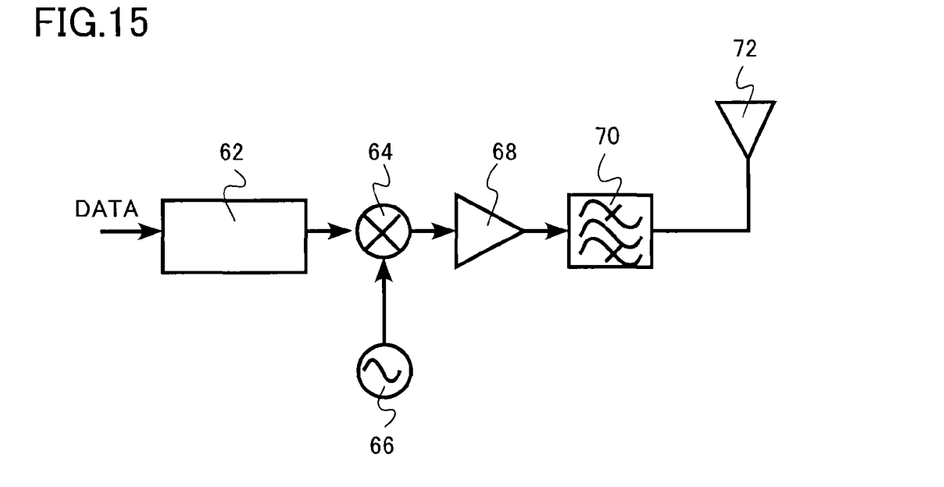
FIG. 15 is a schematic diagram of a wireless system according to a fifth embodiment.
Figure 16:
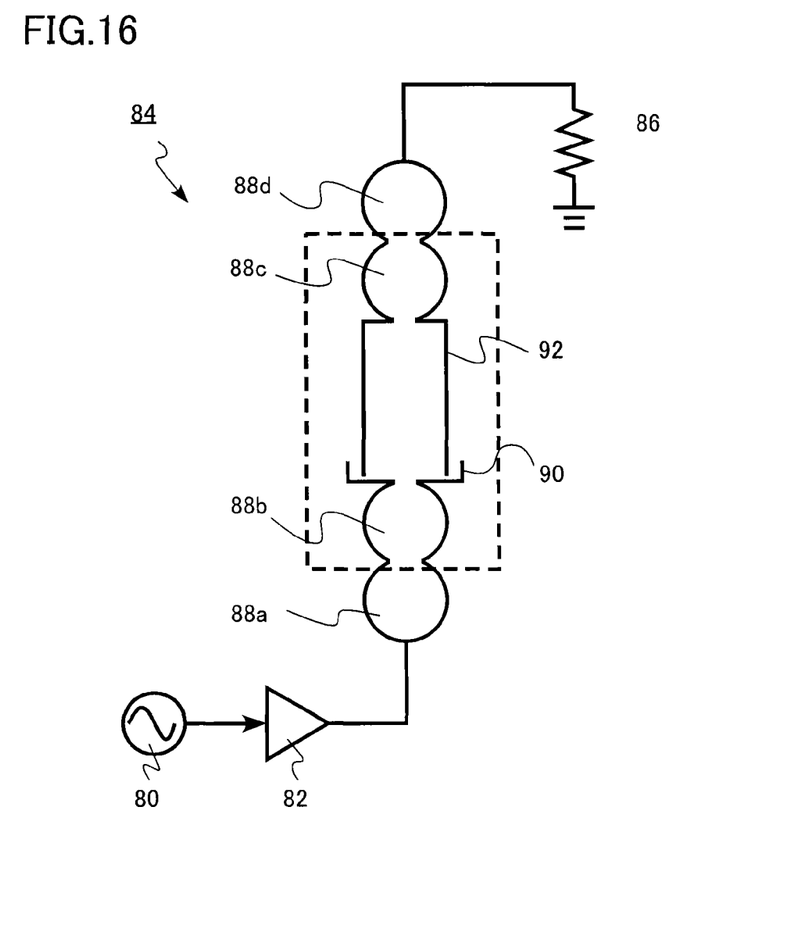
FIG. 16 is a schematic diagram of a wireless system according to a sixth embodiment.

FIG. 15 is a schematic diagram of a wireless system according to the present embodiment. The wireless system according to the present embodiment is a wireless communication device. FIG. 16 shows an overview of a transmitting unit of the wireless communication device.

As shown in FIG. 15, the wireless communication device includes a signal processing circuit 62, a frequency converter (mixer) 64, a local signal generator 66, a power amplifier 68, a band pass filter 70, and an antenna 72.

Data to be transmitted is input to the signal processing circuit 62, and a series of processes is carried out such as digital-analog conversion, encoding, and modulation, so that a transmission signal of a base band, or of an intermediate frequency (IF) band is generated. The transmission signal from the signal processing circuit 62 is input to the frequency converter (mixer) 64, and is converted into, that is, up-converted into a signal of a radio frequency (RF) band by being multiplied by a local signal from the local signal generator 66.

After the RF signal output from the mixer 64 is amplified by the power amplifier 68, the RF signal is input to the band pass filter 70. After unnecessary frequency components are removed by band restriction of the band pass filter 70, the RF signal is provided to the antenna 72. Here, the radio-frequency filters of the first to fourth embodiments are used as the band pass filter 70.

According to the present embodiment, a low-loss wireless communication device can be realized by using the low-loss radio-frequency filters.

[Sixth Embodiment]

A wireless system according to the present embodiment is used for wireless power transmission, and is a system which uses a resonance element for transmitting a radio-frequency signal, the resonance element including a first circuit element group, a second circuit element group, a first circuit element belongs to the first circuit element group, a second circuit element belongs to the second circuit element group, and a transmission line connecting the first circuit element and the second circuit element, a peak of even mode resonance in which the first circuit element and the second circuit element resonate in the same phase being within a bandwidth of a transmission signal, a peak of odd mode resonance in which the first circuit element and the second circuit element resonate in a reverse phase being outside the bandwidth. Contents which overlap with the first to fourth embodiments are omitted below.

FIG. 16 is a schematic diagram of a wireless system according to the present embodiment. The wireless system according to the present embodiment is a wireless power transmission system.

The wireless power transmission system of the present embodiment includes a signal source 80, an amplifier 82, a band pass filter 84, and a load 86.

The band pass filter 84 includes four cavity resonance elements 88a, 88b, 88c, and 88d. The cavity resonance elements 88a and 88b constitute a first circuit element group, and the cavity resonance elements 88c and 88d constitute a second circuit element group. Also, the second cavity resonance element (a first circuit element) 88b and the third cavity resonance element (a second circuit element) 88c are connected by a connection transmission line which is configured from a transmitter 90 and a receiver 92.

The transmitter 90 of a connection line connected to the cavity resonance element 88b and the receiver 92 of the connection line connected to the cavity resonance element 88c may not be fully connected as long as a part of the connection transmission line can transmit power. For example, the transmitter 90 and the receiver 92 may form a choke structure in waveguide connection. Also, the transmitter 90 and the receiver 92 can be connected via a spacing (gap).

Therefore, the transmitter 90 and the receiver 92 are separated, and the part from the signal source 80 to the transmitter 90 in FIG. 16 is caused to be a transmitting unit and the part from the receiver 92 to the load 86 in FIG. 16 is caused to be a receiving unit, whereby the wireless power transmission system is configured. In wireless power transmission, loss at a wireless connection part between the transmitting unit and the receiving unit has significant impact on transmission efficiency.

Therefore, according to the present embodiment, it is possible to reduce the influence of the loss by connecting the second cavity resonance element (the first circuit element) 88b and the third cavity resonance element (the second circuit element) 88c by the connection transmission line by means of even mode connection. Also, in the present embodiment, because a part of the band pass filter 84 contributes to power transfer, another filter is not necessary to provide, whereby the system can be simplified.

While certain embodiments have been described, these embodiments have been presented by way of example only, and are not intended to limit the scope of the inventions. Indeed, a resonance element, a radio-frequency filter, and a wireless system described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A resonance element for transmitting a radio-frequency signal, comprising:
    a first substrate;
    a second substrate;
    a first circuit element formed on the first substrate, the first circuit element having a first resonant property;
    a second circuit element formed on the second substrate, the second circuit element having a second resonant property; and
    a transmission line connecting the first circuit element and the second circuit element, wherein a peak of even mode resonance in which the first circuit element and the second circuit element resonate in a same phase is within a bandwidth of a transmission signal, and a peak of odd mode resonance in which the first circuit element and the second circuit element resonate in a reverse phase is outside the bandwidth, and wherein when a central frequency of the transmission signal is represented as $f_0$ and the bandwidth of the transmission signal is represented as BW, an electrical length $\phi$ of the transmission line satisfies one of two limitations identified in the following formula 1, $$0 < \phi < 90 - \frac{BW}{f_0} \cdot 180, \quad \text{formula 1}$$
$$90 \cdot n + \frac{BW}{f_0} \cdot 180 < \phi < 90 \cdot (n+1) - \frac{BW}{f_0} \cdot 180$$

(n is a positive integer).

2. A wireless system comprising the resonance element according to claim 1.

3. The resonance element according to claim 1, wherein the transmission line includes a coaxial cable.

4. The resonance element according to claim 1, further comprising:
a third substrate,
wherein the transmission line is formed on the third substrate, and the first circuit element and the transmission line, and the second circuit element and the transmission line are physically separated.

5. The resonance element according to claim 1, wherein the transmission line includes a waveguide.

6. The resonance element according to claim 1, wherein the first circuit element and the second circuit element include a superconductor.

7. The resonance element according to claim 1, wherein the transmission line includes a superconductor.

8. A radio-frequency filter comprising:
a first substrate;
a second substrate;
a first resonance element including a first circuit element formed on the first substrate, a second circuit element formed on the second substrate, and a transmission line connecting the first circuit element and the second circuit element, a peak of even mode resonance in which the first circuit element and the second circuit element resonate in a same phase being within a bandwidth of a filter circuit, a peak of odd mode resonance in which the first circuit element and the second circuit element resonate in a reverse phase being outside the bandwidth;
a second resonance element formed on the first substrate and connected to the first resonance element; and
a third resonance element formed on the second substrate and connected to the first resonance element,
wherein when a central frequency of the filter circuit is represented as $f_0$, and the bandwidth is represented as BW, an electrical length $\phi$ of the transmission line satisfies one of two limitations identified in the following formula 1, $$0 < \phi < 90 - \frac{BW}{f_0} \cdot 180, \quad \text{formula 1}$$
$$90 \cdot n + \frac{BW}{f_0} \cdot 180 < \phi < 90 \cdot (n+1) - \frac{BW}{f_0} \cdot 180$$

(n is a positive integer).

9. A resonance element for transmitting a radio-frequency signal, comprising:
a first circuit element group;
a second circuit element group;
a first circuit element belongs to the first circuit element group, the first circuit element having resonant property;
a second circuit element belongs to the second circuit element group, the second circuit element having a first resonant property; and
a transmission line connecting the first circuit element and the second circuit element,
wherein a peak of even mode a second resonance in which the first circuit element and the second circuit element resonate in a same phase is within a bandwidth of a transmission signal, and a peak of odd mode resonance in which the first circuit element and the second circuit element resonate in a reverse phase is outside the bandwidth, and
wherein when a central frequency of the transmission signal is represented as $f_0$ and the bandwidth of the transmission signal is represented as BW, an electrical length $\phi$ of the transmission line satisfies one of two limitations identified in the following formula 1, $$0 < \phi < 90 - \frac{BW}{f_0} \cdot 180, \quad \text{formula 1}$$
$$90 \cdot n + \frac{BW}{f_0} \cdot 180 < \phi < 90 \cdot (n+1) - \frac{BW}{f_0} \cdot 180$$

(n is a positive integer).

10. The resonance element according to claim 9, wherein the first circuit element and the second circuit element are cavity resonance elements.

* * * * *